US011245358B1

(12) United States Patent
Su et al.

(10) Patent No.: US 11,245,358 B1
(45) Date of Patent: Feb. 8, 2022

(54) VOLTAGE CONTROLLED OSCILLATOR

(71) Applicant: NOVATEK Microelectronics Corp., Hsin-Chu (TW)

(72) Inventors: Cheng-Dao Su, Hsinchu County (TW); Tzu-Cheng Yang, Hsinchu (TW); Chih-Hung Chen, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 17/105,454

(22) Filed: Nov. 25, 2020

(51) Int. Cl.
*H03L 1/00* (2006.01)
*G05F 3/26* (2006.01)
*H03B 5/04* (2006.01)
*H03K 3/011* (2006.01)
*H03K 3/013* (2006.01)
*H03B 5/12* (2006.01)

(52) U.S. Cl.
CPC ............... *H03B 5/04* (2013.01); *G05F 3/262* (2013.01); *H03B 5/12* (2013.01); *H03K 3/011* (2013.01); *H03K 3/013* (2013.01); *H03L 1/00* (2013.01); *H03B 2200/009* (2013.01); *H03B 2200/0038* (2013.01); *H03B 2200/0082* (2013.01); *H03B 2202/042* (2013.01)

(58) Field of Classification Search
CPC .. G05F 3/262; H03B 5/04; H03B 5/12; H03B 2200/0038; H03B 2200/0082; H03B 2200/0088; H03B 2200/009; H03B 2201/038; H03B 2202/042; H03B 2202/06; H03K 3/011; H03K 3/013; H03L 1/00
See application file for complete search history.

(56) References Cited

U.S. PATENT DOCUMENTS

| | | | | |
|---|---|---|---|---|
| 5,909,150 A * | 6/1999 | Kostelnik | .......... | G11B 20/1403 331/34 |
| 6,326,855 B1 * | 12/2001 | Jelinek | ...................... | H03L 1/00 327/103 |
| 9,000,857 B2 * | 4/2015 | Lahiri | ................... | H03L 7/0995 331/186 |
| 9,054,633 B2 * | 6/2015 | Niki | ......................... | H03B 5/04 |
| 10,333,530 B1 * | 6/2019 | Katsuragi | ............... | H03L 7/093 |
| 2005/0225398 A1 * | 10/2005 | Chien | ....................... | H03B 5/04 331/16 |

* cited by examiner

*Primary Examiner* — Levi Gannon
(74) *Attorney, Agent, or Firm* — Winston Hsu

(57) ABSTRACT

A voltage controlled oscillator is provided. The voltage controlled oscillator includes a current controlled oscillator, a voltage to current conversion circuit and a noise cancellation circuit. The current controlled oscillator is configured to receive a bias current and generate an oscillating signal with an oscillating frequency according to the bias current. The voltage to current conversion circuit is coupled to a power supply voltage and configured to generate a supply current according to an input voltage. The noise cancellation circuit is configured to receive a bias voltage and the supply current from the voltage to current conversion circuit, and configured to generate a noise cancellation current in response to power supply voltage variation and cancel the noise cancellation current from the supply current to generate the bias current. The bias voltage of the noise cancellation circuit is coupled to an internal voltage of the voltage to current conversion circuit.

16 Claims, 9 Drawing Sheets

VOLTAGE CONTROLLED OSCILLATOR

BACKGROUND OF THE INVENTION

1. Field of the Invention

The present invention relates to a voltage controlled oscillator, and more particularly, to a voltage controlled oscillator with high power supply rejection ratio and power efficiency.

2. Description of the Prior Art

A voltage-controlled oscillator (VCO) is an important component in many electronic systems, and may be applied in varies electronic circuit devices, for example, in a phase lock loop (PLL) or a clock and data recovery (CDR) circuit. The voltage-controlled oscillator is applied to generate an oscillation signal with accurate and stable frequency. However, noise may be introduced by the power supply. Power supply noise may affect the output frequency and stability of the VCO, thereby resulting in poor PSRR and high power consumption. Thus, how to improve the performance and reduce power consumption for a VCO is a significant objective in the field.

SUMMARY OF THE INVENTION

It is therefore an objective of the present invention to provide a voltage controlled oscillator with high power supply rejection ratio and power efficiency.

An embodiment of the present invention discloses a voltage controlled oscillator, comprising: a current controlled oscillator, configured to receive a bias current and generate an oscillating signal with an oscillating frequency according to the bias current; a voltage to current conversion circuit, coupled to a power supply voltage and configured to generate a supply current according to an input voltage; and a noise cancellation circuit, coupled to the power supply voltage and the voltage to current conversion circuit, for receiving a bias voltage and the supply current from the voltage to current conversion circuit, and configured to generate a noise cancellation current in response to power supply voltage variation and cancel the noise cancellation current from the supply current to generate the bias current, wherein the bias voltage of the noise cancellation circuit is coupled to an internal voltage of the voltage to current conversion circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
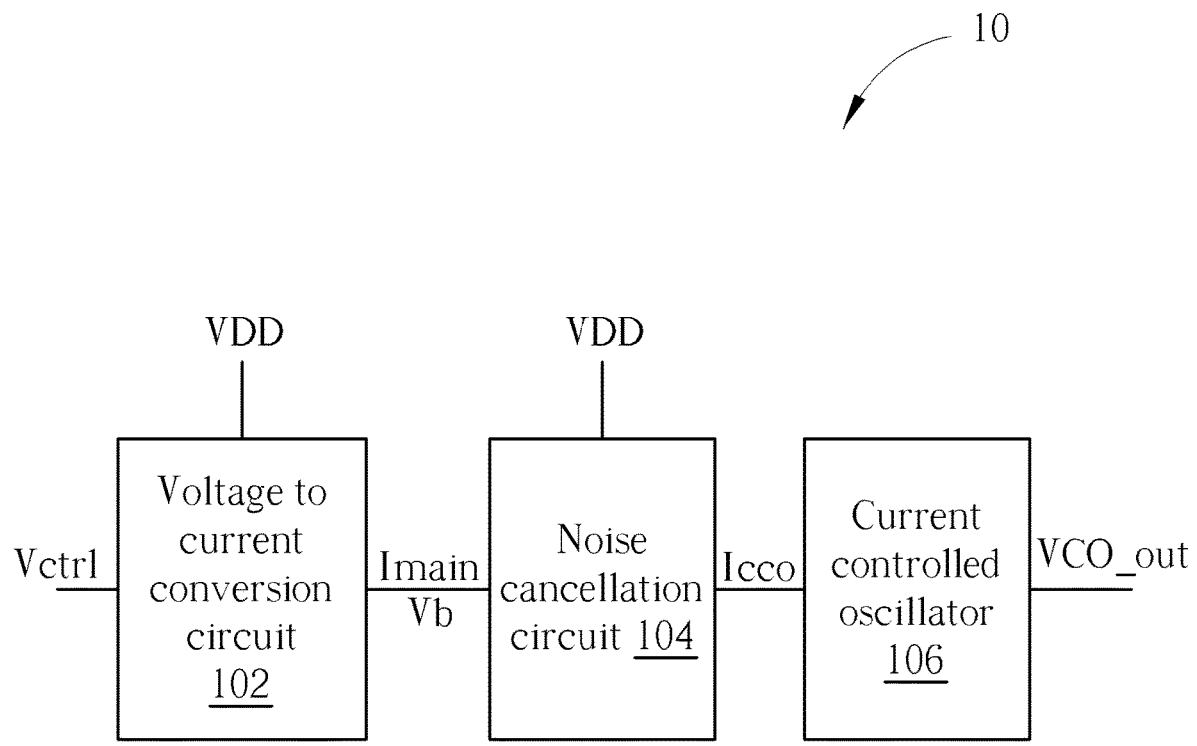
FIG. 1 is a schematic diagram of a voltage controlled oscillator according to an embodiment of the present invention.

Please refer to FIG. 1, which is a schematic diagram of a voltage controlled oscillator (VCO) 10 according to an embodiment of the present invention. The VCO 10 is utilized for generating an oscillating signal VCO_out with an oscillating frequency according to an input voltage Vctrl. The input voltage Vctrl may be provided in analog or digital controlled options. The applied input voltage Vctrl may determine the oscillation frequency. As shown in FIG. 1, the VCO 10 includes a voltage to current conversion circuit 102, a noise cancellation circuit 104 and a current controlled oscillator 106. The voltage to current conversion circuit 102 is coupled to a power supply voltage VDD and configured to generate a supply current Imain according to an input voltage Vctrl. The noise cancellation circuit 104 is coupled to the power supply voltage VDD and the voltage to current conversion circuit 102. The noise cancellation circuit 104 is configured to receive a bias voltage Vb and the supply current Imain from the voltage to current conversion circuit 102. The noise cancellation circuit 104 is configured to generate a noise cancellation current Icancel in response to variations of the power supply voltage VDD and the bias voltage Vb, and is configured to cancel the noise cancellation current Icancel from the supply current Imain to generate a bias current Icco. The current controlled oscillator 106 is configured to receive the bias current Icco from the noise cancellation circuit 104 and generate an oscillating signal VCO_out with an oscillating frequency according to the bias current Icoo. The oscillating frequency of oscillating signal VCO_out may vary depending on the bias current Icco.

Figure 2:
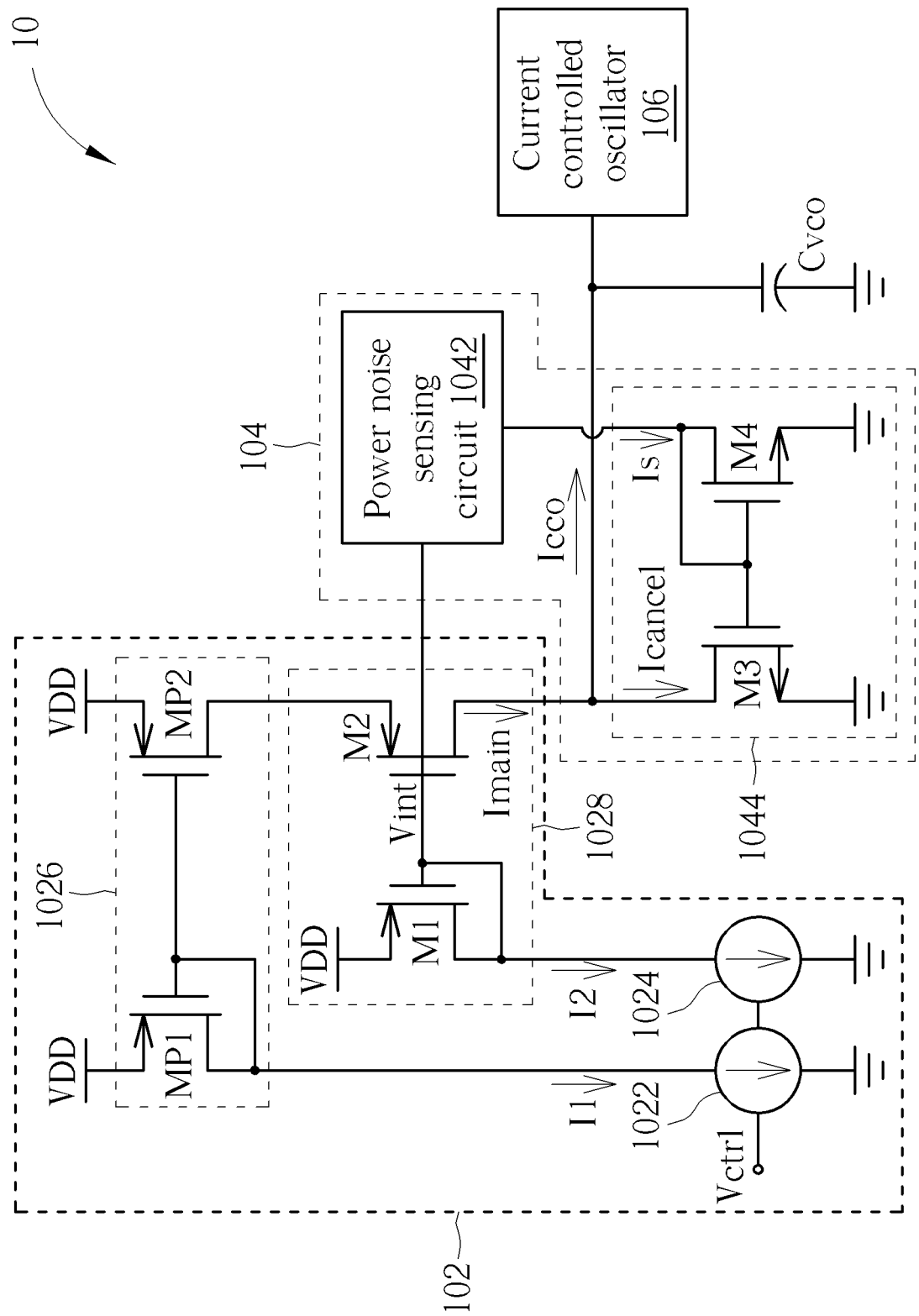
FIG. 2 is a schematic diagram illustrating an exemplary circuit structure of the voltage controlled oscillator shown in FIG. 1 according to an embodiment of the present invention.

Please refer to FIG. 2, which illustrates an exemplary circuit structure of the VCO 10 shown in FIG. 1 according to an embodiment of the present invention. The voltage to current conversion circuit 102 includes current sources 1022, 1024, a transistor pair 1026 and a voltage generation circuit 1028. The current source 1022 is configured to generate a reference current I1 according to an input voltage Vctrl. The input voltage Vctrl may be analog or digital controlled. The current source 1024 is configured to generate a reference current I2 according to the input voltage Vctrl. The reference current I2 may be proportional to the reference current I1. For example, the reference current I2 may be equal to alpha (α) times the reference current I1, wherein α represents a current gain of the voltage to current conversion circuit 102 and α may be equal to or smaller than 1.

Figure 3:
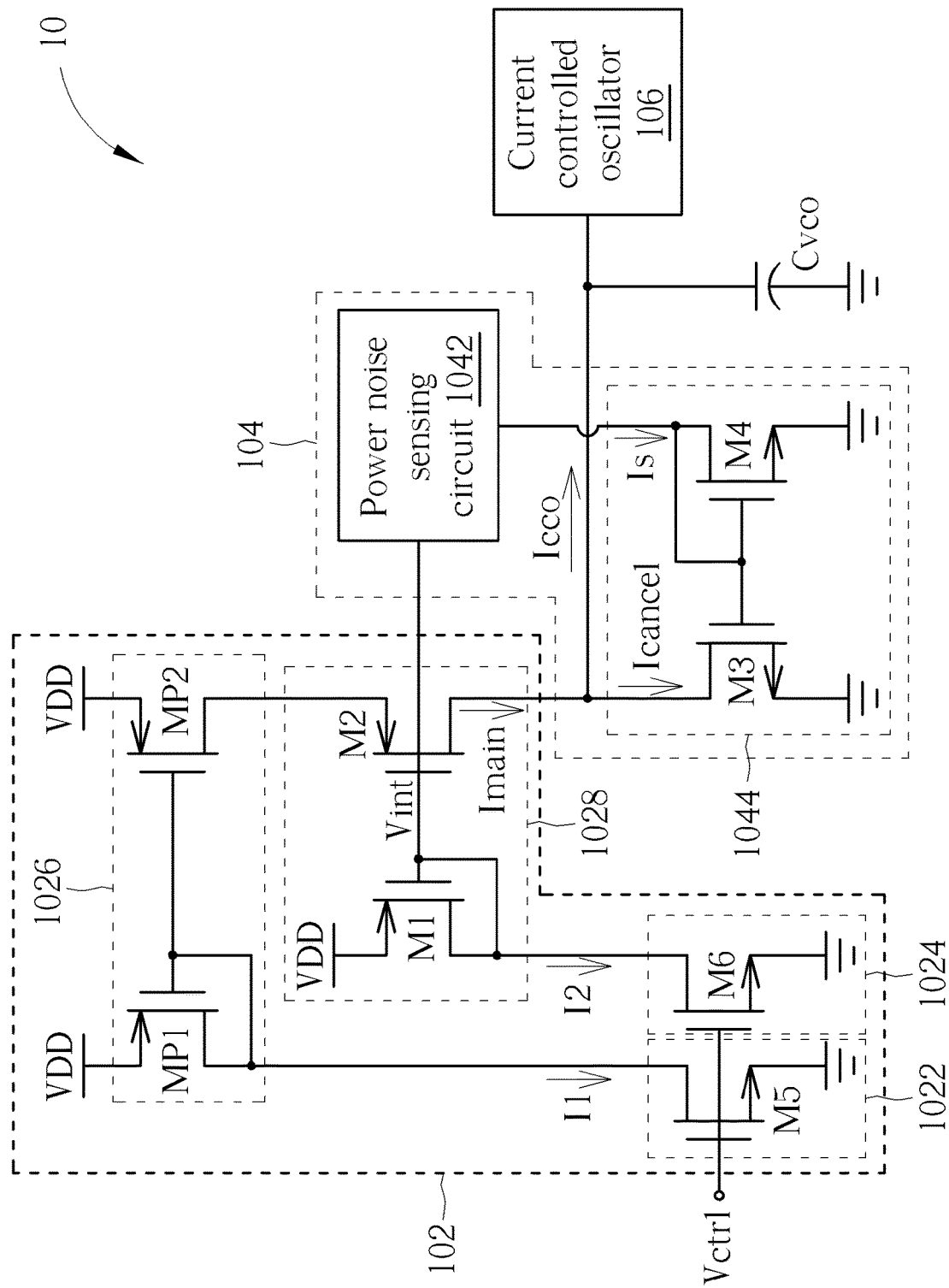
FIG. 3 is a schematic diagram of the current sources shown in FIG. 2 according to an embodiment of the present invention.

Please refer to FIG. 3, which is a schematic diagram of the current sources shown in FIG. 2 according to an embodiment of the present invention. As shown in FIG. 3, the current source 1022 includes a transistor M5, and the current source 1024 includes a transistor M6. The transistors M5 and M6 may be metal oxide semiconductor (MOS) transistors or other devices having similar functions. For example, as shown in FIG. 3, the transistors M5 and M6 may be n-type MOS (NMOS) transistors. The gate terminal of the transistor M5 is coupled to the input voltage Vctrl. The drain terminal of the transistor M5 is coupled to the transistor pair 1026 to provide the reference current I1. The gate terminal of the transistor M6 is coupled to the input voltage Vctrl. The drain terminal of the transistor M6 is coupled to the voltage generation circuit 1028 to provide the reference current I2. For example, the width to length (W/L) ratio of the transistor M6 may be α times the W/L ratio of the transistor M5, wherein α represents a current gain of the voltage to current conversion circuit 102 and α may be equal to or smaller than 1.

Please further refer to FIG. 2, the transistor pair 1026 is coupled to the current source 1022. The transistor pair 1026 includes transistors MP1 and MP2. The transistors MP1 and MP2 may be MOS transistors or other devices having similar functions. For example, the transistors MP1 and MP2 may be p-type MOS (PMOS) transistors. The source terminal of the transistor MP1 is coupled to the power supply voltage VDD, the gate terminal of the transistor MP1 is coupled to the drain terminal of the transistor MP1 and the gate terminal of the transistor MP2, and the drain terminal of the transistor MP1 is coupled to the current source 1022. The transistor MP1 is configured to mirror the reference current I1. The source terminal of the transistor MP2 is coupled to the power supply voltage VDD, the gate terminal is coupled to the drain terminal and the gate terminal of the transistor MP1, and the drain terminal of the transistor MP2 is coupled to the voltage generation circuit 1028. The transistor MP2 is configured to output the supply current Imain which is the mirrored reference current I1.

The voltage generation circuit 1028 is coupled to the current source 1024 and the noise cancellation circuit 104. The voltage generation circuit 1028 is configured to provide an internal voltage Vint of the voltage to current conversion circuit 102 to the noise cancellation circuit 104. The internal voltage Vint may be independent from a circuit that generates the supply current Imain in the voltage to current conversion circuit 102. As shown in FIG. 2, the voltage generation circuit 1028 includes transistors M1 and M2. The transistors M1 and M2 may be MOS transistors or other devices having similar functions. For example, the transistors M1 and M2 may be PMOS transistors. The source terminal of the transistor M1 is coupled to the power supply voltage VDD. The gate terminal of the transistor M1 is coupled to the drain terminal of the transistors M1, the gate terminal of the transistors M2 and the noise cancellation circuit 104. The drain terminal of the transistor M1 is coupled to the current source 1024 to receive the reference current I2. The internal voltage Vint varies depending on the reference current I2. The voltage of the gate terminal of the transistor M1 is the internal voltage Vint. The source terminal of the transistor M2 is coupled to the drain terminal of the transistor MP2 to receive the supply current Imain. The gate terminal of the transistor M2 is coupled to the gate terminal of the transistor M1. The drain terminal of the transistor M2 is coupled to the noise cancellation circuit 104 to output the supply current Imain. In an alternative embodiment, the transistor M2 may be omitted or have another configuration.

To improve the efficiency of the power supply, one of techniques is to let the supply current Imain become less sensitive to the variation of the power supply voltage VDD, that is, to decrease the transconductance of the power supply. As shown in FIG. 2, the supply current Imain is generated by the transistor MP2 based on the power supply voltage VDD and flows through the transistors MP2 and M2 to noise cancellation circuit 104. Since the transistor M2 is coupled in cascade to the transistor MP2, the output resistance looking from the drain terminal of the transistor M2 into the voltage to current conversion circuit 102 is increased and the transconductance of the power supply (power supply voltage VDD) is decreased. As the transconductance of the power supply (power supply voltage VDD) is decreased, the supply current Imain may have less sensitivity to the power supply noise.

Moreover, the noise cancellation circuit 104 includes a power noise sensing circuit 1042 and a current mirror 1044. The power noise sensing circuit 1042 is coupled to the voltage to current conversion circuit 102 and the power supply voltage VDD. The power noise sensing circuit 1042 is configured to receive the bias voltage Vb and the supply current Imain from the voltage to current conversion circuit 102. For example, as show in FIG. 2, the bias voltage Vb of the noise cancellation circuit 104 is coupled to the internal voltage Vint of the voltage to current conversion circuit 102. The power noise sensing circuit 1042 is coupled to the gate terminal of the transistor M1 to receive the internal voltage Vint for acting as the bias voltage Vb of the power noise sensing circuit 1042. The bias voltage Vb may be equal to the internal voltage Vint since the noise cancellation circuit 104 is coupled to the gate terminal of the transistor M1 of the voltage generation circuit 1028. The bias voltage Vb (i.e. internal voltage Vint) may serve as a control voltage or a bias voltage of the noise cancellation circuit 104. The power noise sensing circuit 1042 is configured to generate a sensing current Is in response to variations of the power supply voltage VDD and the bias voltage Vb (i.e. the internal voltage Vint). The sensing current Is may be determined according to the power supply voltage VDD and the bias voltage Vb (i.e. the internal voltage Vint).

The current mirror 1044 is coupled to the power noise sensing circuit 1042, the voltage to current conversion circuit 102 and the current controlled oscillator 106. The current mirror 1044 is configured to mirror the sensing current Is onto the noise cancellation current Icancel. As shown in FIG. 2, the current mirror 1044 includes transistors M3 and M4. For example, the transistors M3 and M4 may be MOS transistors or other devices having similar functions. The gate terminal of the transistor M4 is coupled to the drain terminal of the transistor M4 and the gate terminal of the transistor M3. The drain terminal of the transistor M4 is coupled to the power noise sensing circuit 1042. The transistor M4 is configured to mirror the sensing current Is. The drain terminal of the transistor M3 is coupled to the drain terminal of the transistor M2 of the voltage generation circuit 1028 and the current controlled oscillator 106. The transistor M3 is configured to generate the noise cancellation current Icancel which is the mirrored sensing current Is and cancel the noise cancellation current Icancel from the supply current Imain to generate the bias current Icco. The bias current Icco is outputted to the current controlled oscillator 106. The noise cancellation current Icancel may be proportional to the sensing current Is. For example, the noise cancellation current Icancel may be equal to beta (β) times the sensing current Is, wherein β represents a current gain (current mirror ratio) of the current mirror 1044 and β may be equal to or greater than 1. For example, the W/L ratio of the transistor M3 may be β times the W/L ratio of the transistor M4. In an embodiment, the current gain α of the voltage to current conversion circuit 102 may be equal to or smaller than 1 and the current gain (current mirror ratio) β of the current mirror 1044 may be equal to or greater than 1. A product of the current gain α of the voltage to current conversion circuit 102 and the current gain (current mirror ratio) β of the current mirror 1044 may be equal to 1 (αβ=1).

When the power supply voltage VDD increases, the supply current Imain increases and the power noise sensing circuit may generate more noise cancellation current Icancel, such that the bias current Icco decreases. On the other side, when the power supply voltage VDD decreases, the supply current Imain decreases and the power noise sensing circuit may generate less noise cancellation current Icancel, such that the bias current Icco increase. Based on proper setting of the current gain α and the current gain β, the variation of the supply current due to the power supply noise can be removed by the noise cancellation current. As a result, the variation of the power supply voltage VDD may not influence the bias current Icco provided to the current controlled oscillator 106, and the bias current Icco keeps stable.

Figure 4:
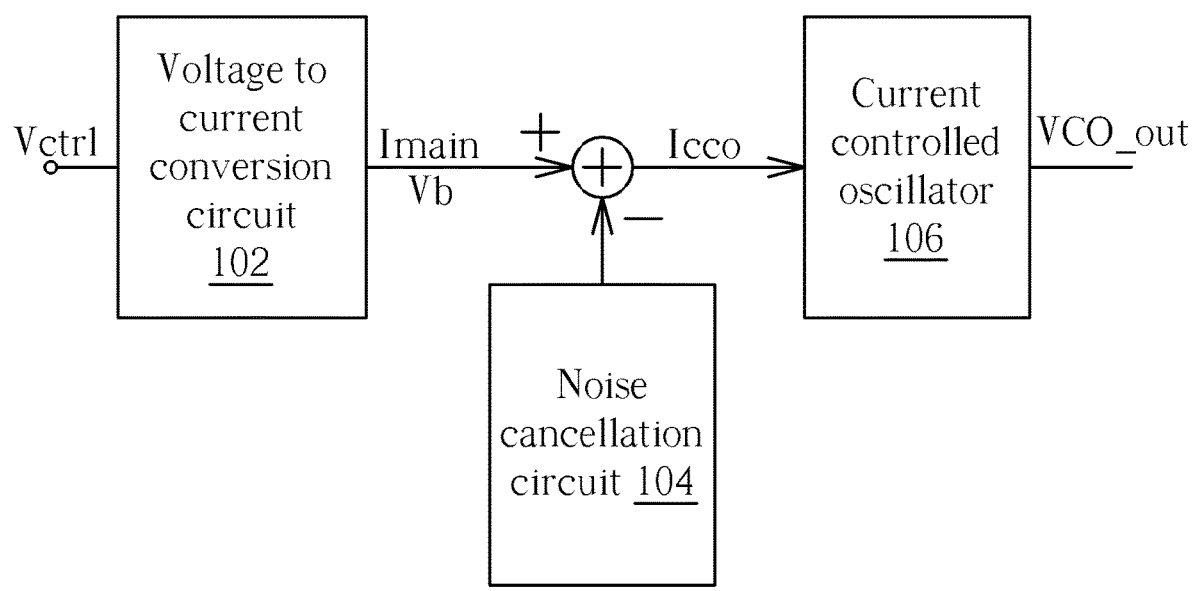
FIG. 4 is a schematic diagram of an equivalent circuit topology of the voltage controlled oscillator according to an embodiment of the present invention.

Please refer to FIG. 4. FIG. 4 is a schematic diagram of an equivalent circuit topology of the VCO 10 according to an embodiment of the present invention. The voltage to current conversion circuit 102 generates the supply current Imain. The noise cancellation circuit 104 generates the noise cancellation current Icancel in response to variations of the power supply voltage VDD and the bias voltage Vb (i.e. the internal voltage Vint). Moreover, the noise cancellation circuit 104 cancels the noise cancellation current Icancel from the supply current Imain so as to generate the bias current Icco. In more detail, when the power supply is perturbed by noise, the noise may be injected into the power supply voltage VDD. Since the supply current Imain is generated based on the power supply voltage VDD, the supply current Imain may be sensitive to the power supply voltage VDD including power supply noise. As such, the noise cancellation circuit 104 generates the noise cancellation current Icancel in response to variations of the power supply voltage VDD and the bias voltage Vb (i.e. the internal voltage Vint) so as to eliminate or reduce the noise introduced by supply signal VDD. As shown in FIG. 4, the resulting output (i.e. the bias current Icco) of the noise cancellation circuit 104 may be viewed as the difference between the supply current Imain and the noise cancellation current Icancel. The bias current Icco may be generated by subtracting the noise cancellation current Icancel from the supply current Imain so as to cancel out the noise component in the supply voltage VDD.

To improve the efficiency of the power supply, another technique is to let the noise cancellation current Icancel become more sensitive to the variation of the power supply voltage VDD, that is, to increase the transconductance of the power noise sensing circuit 1042. Please further refer to FIGS. 2 and 3 As the transconductance of the power noise sensing circuit 1042 increases, the sensing current Is and the noise current Icancel have more sensitivity to the power supply noise. As the noise cancellation current Icancel has more sensitivity to the power supply voltage VDD, the noise cancellation current Icancel may more efficiently compensate variations of the power supply voltage VDD due to power supply noise. In other words, the noise cancellation circuit 104 may generate the noise cancellation current Icancel that can remove noise introduced by the supply voltage VDD in the supply current Imain and reduce the impact of the supply voltage variations due to the effect of the power supply noise, thus improving the power supply rejection ratio (PSRR), the power performance and the power efficiency of the VCO 10.

Moreover, the noise cancellation circuit 104 is configured to provide the bias current Icoo with low noise or noise-free to the current controlled oscillator 106. The current controlled oscillator 106 is configured to receive the bias current Icco from the noise cancellation circuit 104 and generate the oscillating signal VCO_out with the oscillating frequency according to the bias current Icoo. The oscillating frequency of oscillating signal VCO_out may vary depending on the bias current Icco. As the bias current Icoo with low noise or noise-free is applied, the current controlled oscillator 106 may generate the oscillating signal VCO_out which is stabilized to variations of the supply voltage VDD, thus enhancing the output stability of the VCO 10. In addition, the current controlled oscillator 106 further includes an oscillator capacitor Cvco.

Figure 5:
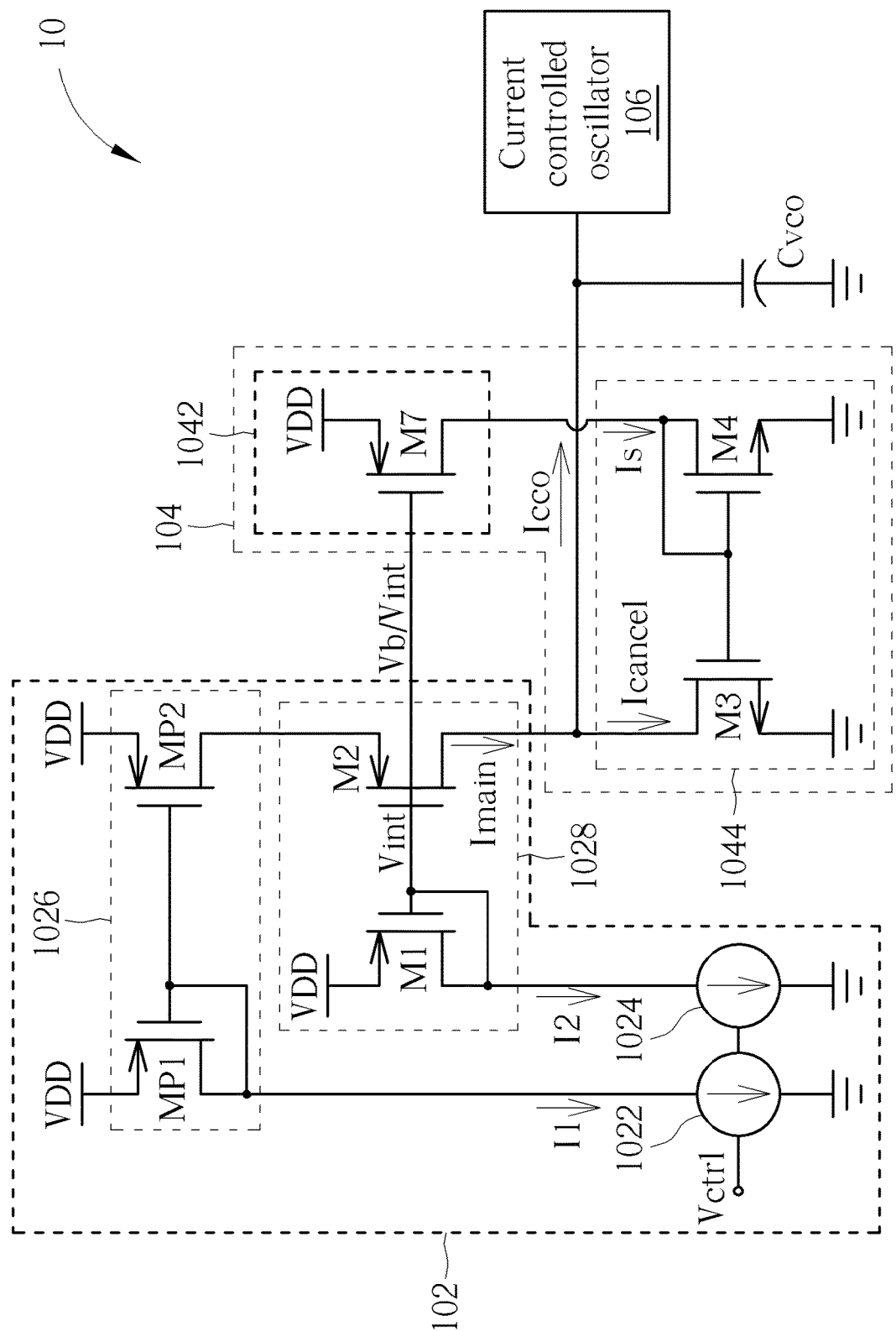
FIG. 5-8 are schematic diagrams of the noise cancellation circuit according to alternative embodiments of the present invention.

Please refer FIG. 5, which is a schematic diagram of the power noise sensing circuit 1042 shown in FIG. 2 according to a first embodiment of the present invention. The power noise sensing circuit 1042 is configured to generate the sensing current Is in response to variations of the power supply voltage VDD and the bias voltage Vb (i.e. the internal voltage Vint). The sensing current Is may be determined according to the power supply voltage VDD and the bias voltage Vb (i.e. the internal voltage Vint). As shown in FIG. 5, the power noise sensing circuit 1042 includes a transistor M7. The transistor M7 may be a PMOS transistor or other devices having similar functions. The source terminal of the transistor M7 is coupled to the power supply voltage VDD. The gate terminal of the transistor M7 is coupled to the gate terminal of the transistor M1 to receive the internal voltage Vint acting as the bias voltage Vb. The drain terminal of the transistor M7 is coupled to the transistor M4 of the current mirror 1044 to provide the sensing current Is. In an embodiment, the W/L ratio of the transistor M7 may be different from the W/L ratio of the transistor MP2. The transconductance of the transistor M7 may be configured based on the W/L ratio of transistor M7. As the transconductance of the transistor M7 is increased, the noise cancellation current Icancel and the sensing current Is have more sensitivity to the power supply voltage VDD while the power supply noise is introduced into the power supply voltage VDD. As the noise cancellation current Icancel has more sensitivity to the power supply voltage VDD, the noise cancellation current Icancel may more efficiently compensate variations of the supply current Imain due to power supply noise introduced by the power supply voltage VDD, thus improving the PSRR and the power efficiency of the VCO 10. In addition, the sensing current Is is derived from the power supply voltage VDD and the bias voltage Vb (i.e. the internal voltage Vint). The internal voltage Vint varies depending on the reference current I2. In an embodiment, the W/L ratio of the transistor M7 may be different from the W/L ratio of the transistor M1. The reference current I2 may be not proportional to sensing current Is by adjusting the W/L ratio of the transistors M1, M7.

Figure 6:
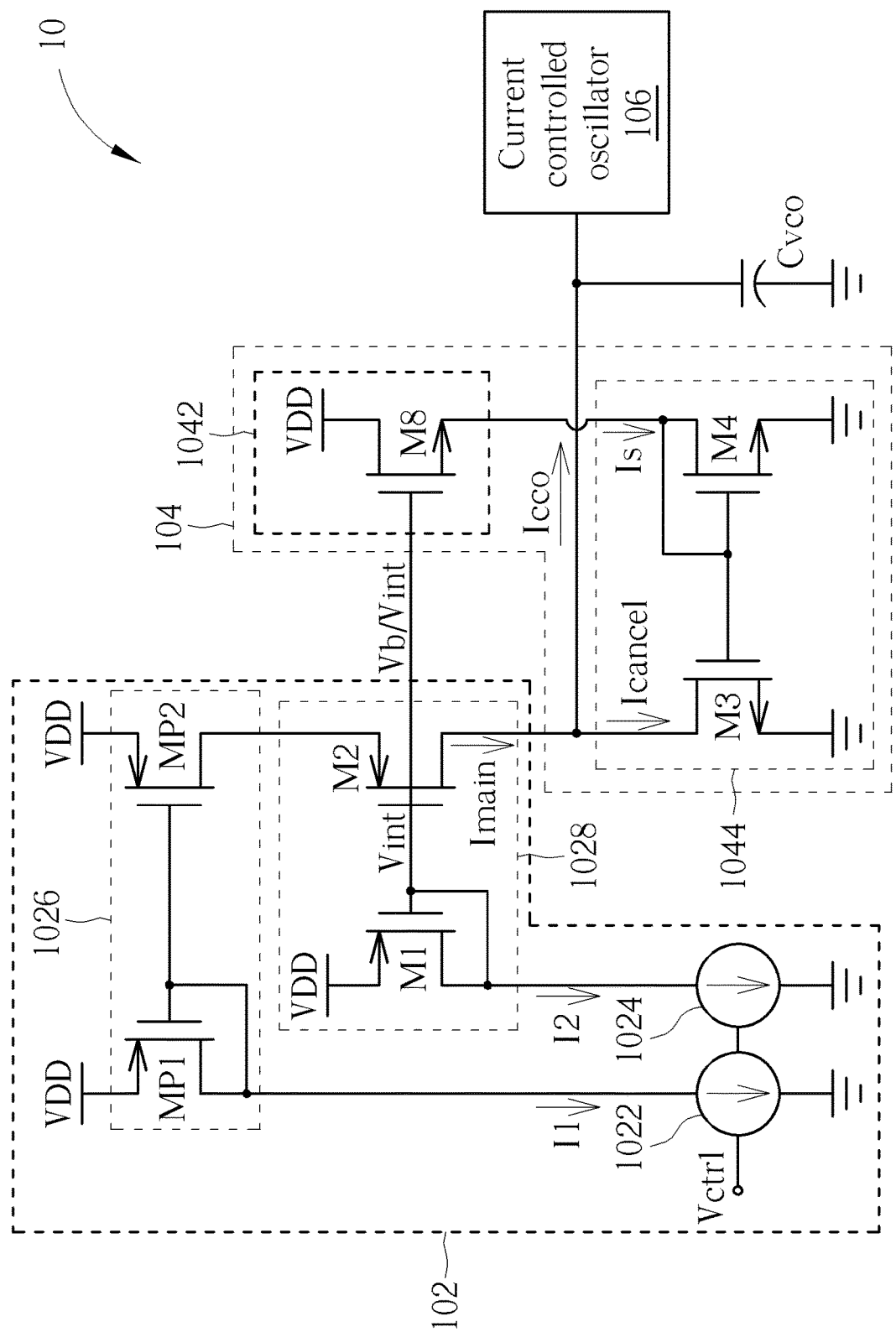

Please refer FIG. 6, which is a schematic diagram of the power noise sensing circuit 1042 shown in FIG. 2 according to a second embodiment of the present invention. As shown in FIG. 6, the power noise sensing circuit 1042 includes a transistor M8. The transistor M8 may be an NMOS transistor or other devices having similar functions. The drain terminal of the transistor M8 is coupled to the power supply voltage VDD. The gate terminal of the transistor M8 is coupled to the gate terminal of the transistor M1 to receive the internal voltage Vint acting as the bias voltage Vb. The source terminal of the transistor M8 is coupled to the transistor M4 of the current mirror 1044 to provide the sensing current Is. In an embodiment, the W/L ratio of the transistor M8 may be different from the W/L ratio of the transistor MP2. The transconductance of the transistor M8 may be configured based on the W/L ratio of transistor M8. As the transconductance of the transistor M8 is increased, the noise cancellation current Icancel and the sensing current Is have more sensitivity to the power supply voltage VDD while the power supply noise is introduced into the power supply voltage VDD. In an embodiment, the W/L ratio of the transistor M8 may be different from the W/L ratio of the transistor M1. The reference current I2 may be not proportional to sensing current Is by adjusting the W/L ratio of the transistors M1, M8.

Figure 7:
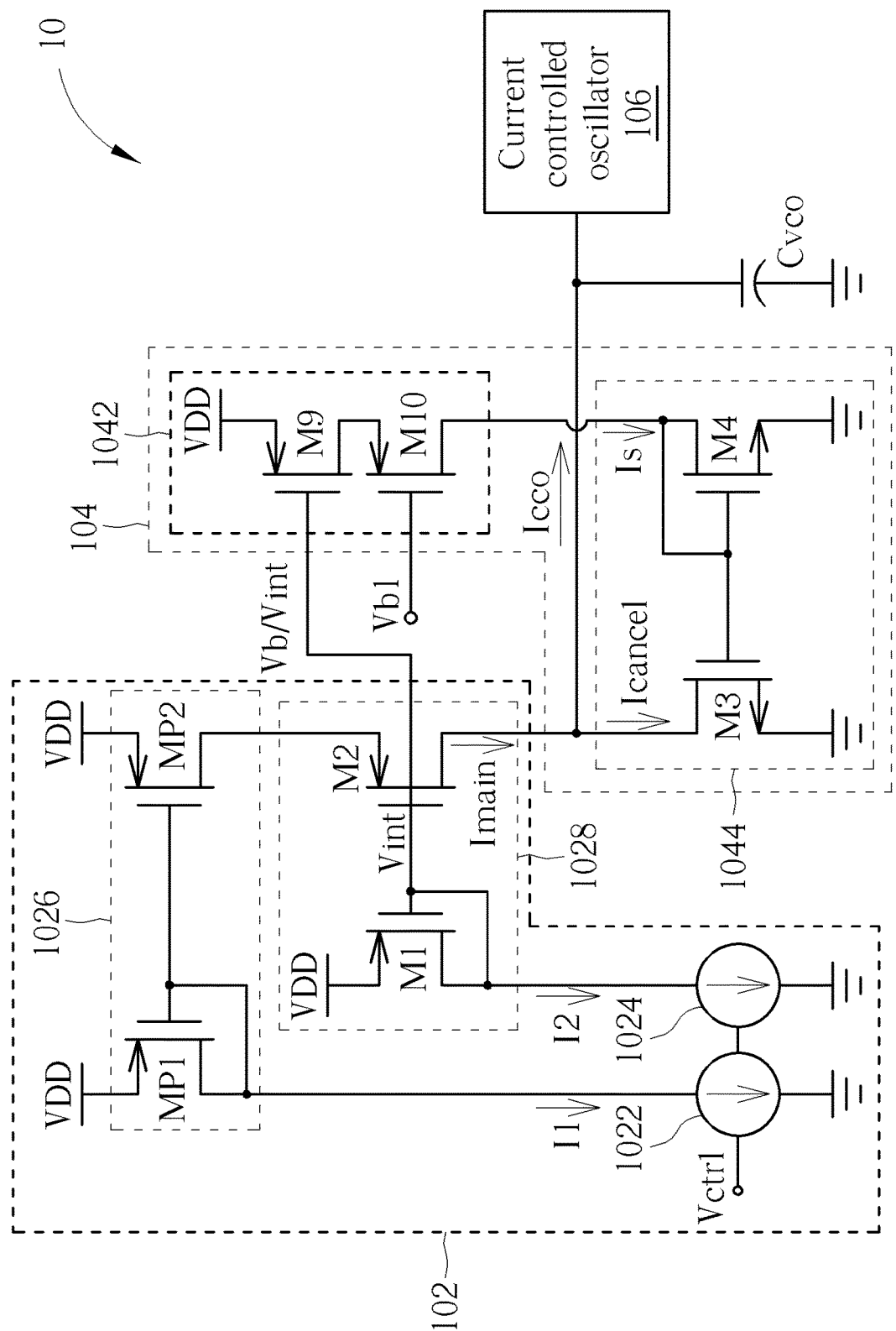

Please refer FIG. 7, which is a schematic diagram of the power noise sensing circuit 1042 shown in FIG. 2 according to a third embodiment of the present invention. As shown in FIG. 7, the power noise sensing circuit 1042 includes transistors M9 and M10. The source terminal of the transistor M9 is coupled to the power supply voltage VDD. The gate terminal of the transistor M9 is coupled to the gate terminal of the transistor M1 to receive the internal voltage Vint acting as the bias voltage Vb. The drain terminal of the transistor M9 is coupled to the source terminal of the transistor M10. The gate terminal of the transistor M9 in coupled to a bias voltage Vb1. The drain terminal of the transistor M10 is coupled to the transistor M4 of the current mirror 1044 to provide the sensing current Is.

Figure 8:
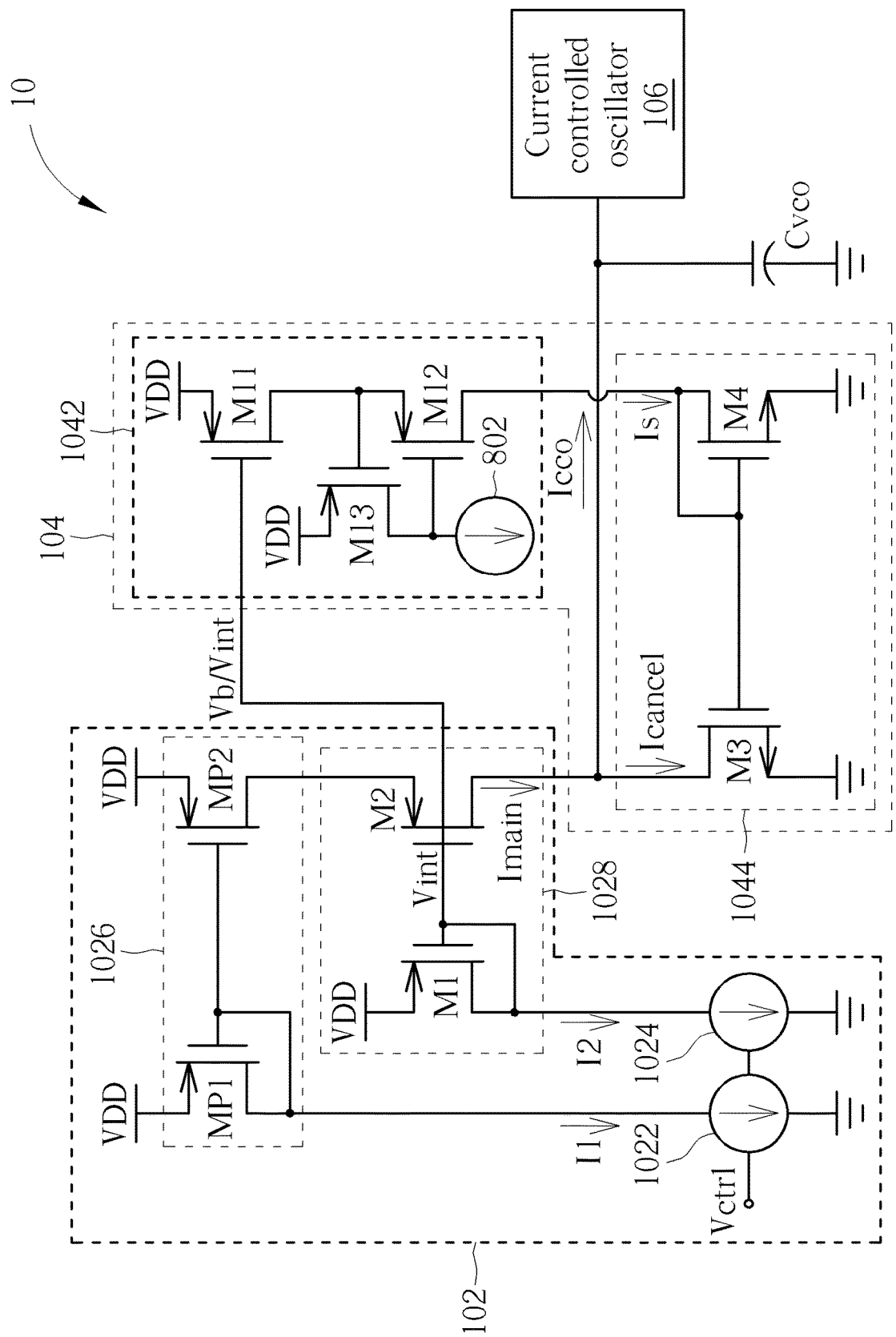

FIG. 8 is a schematic diagram of the power noise sensing circuit 1042 shown in FIG. 2 according to a fourth embodiment of the present invention. As shown in FIG. 8, the power noise sensing circuit 1042 includes transistors M11-M13 and a current source 802. The source terminal of the transistor M11 is coupled to the power supply voltage VDD. The gate terminal of the transistor M911 is coupled to the gate terminal of the transistor M1 to receive the internal voltage Vint acting as the bias voltage Vb. The drain terminal of the transistor M11 is coupled to the gate terminal of the transistor M13 and the source terminal of the transistor M12. The source terminal of the transistor M13 is coupled to the power supply voltage VDD. The drain terminal of the transistor M13 is coupled to the current source 802 and the gate terminal of the transistor M12. The drain terminal of the transistor M12 is coupled to the transistor M4 of the current mirror 1044 to provide the sensing current Is.

Figure 9:
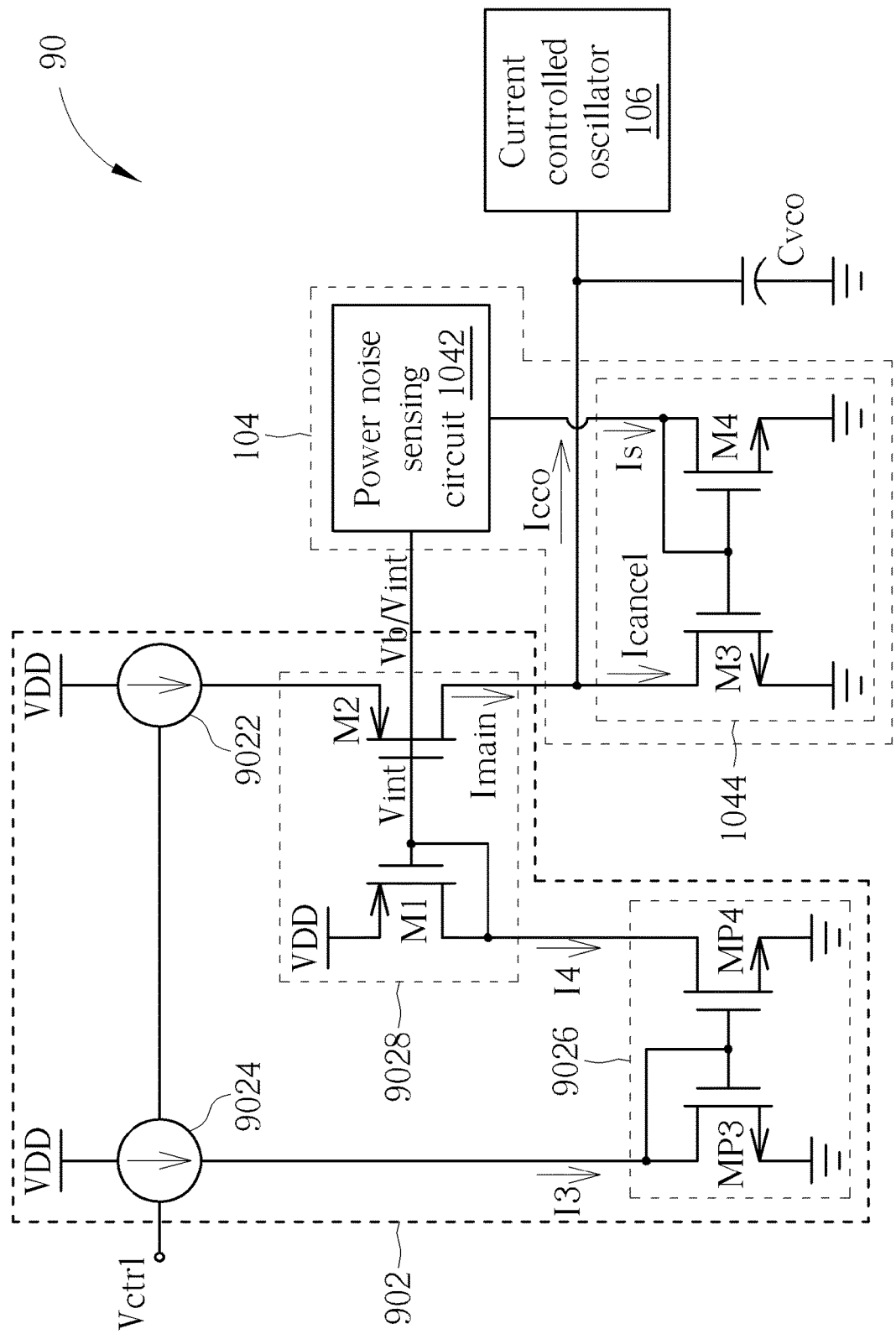
FIG. 9 is a schematic diagram illustrating an exemplary circuit structure of the voltage controlled oscillator shown in FIG. 1 according to an alternative embodiment of the present invention.

Please refer to FIG. 9, which is a schematic diagram of the voltage to current conversion circuit 102 in FIG. 2 according to an alternative embodiment of the present invention. As shown in FIG. 9, an alternative design of the voltage to current conversion circuit is applied in the voltage controlled oscillator 90. The structure of the voltage controlled oscillator 90 shown in FIG. 9 is similar to the structure of the VCO 10 as shown in FIG. 2. The units in the voltage controlled oscillator 90 shown in FIG. 9 with the same designations as those in the VCO 10 shown in FIG. 2 have similar operations and functions. The interconnections of the units are as shown in FIG. 9. The difference between the voltage controlled oscillator 90 as shown in FIG. 9 and the VCO 10 as shown in FIG. 2 is that, the voltage controlled oscillator 90 includes a voltage to current conversion circuit 902. The voltage to current conversion circuit 902 includes current sources 9022, 9024, a transistor pair 9026 and a voltage generation circuit 9028. The current source 9022 is configured to generate a supply current Imain according to an input voltage Vctrl. The current source 9024 is configured to generate a reference current I3 according to the input voltage Vctrl. The reference current I3 may be proportional to the supply current Imain. For example, the reference current I3 may be equal to α times the supply current Imain, wherein α represents a current gain of the voltage to current conversion circuit 902 and a may be equal to or smaller than 1. The current sources 9022, 9024 may be implemented with PMOS transistors. The transistor pair 9026 is coupled to the current source 9024. The transistor pair 9026 includes transistors MP3 and MP4. For example, the transistors MP3 and MP4 may be MOS transistors or other devices having similar functions. The drain terminal of the transistor MP3 is coupled to the current source 9024 and configured to mirror the reference current I3. The transistor MP4 is configured to output a reference current I4 (the mirrored reference current I3). The voltage generation circuit 9028 is coupled to the current source 9026 and the noise cancellation circuit 104. The voltage generation circuit 9028 is configured to provide an internal voltage Vint of the voltage to current conversion circuit 902 to the noise cancellation circuit 104. In an embodiment, the current gain α of the voltage to current conversion circuit 902 may be equal to or smaller than 1 and the current gain (current mirror ratio) β of the current mirror 1044 may be equal to or greater than 1. A product of the current gain α of the voltage to current conversion circuit 902 and the current gain (current mirror ratio) β of the current mirror 1044 may be equal to 1.

To sum up, the embodiment of the present invention may generate the noise cancellation current that can remove the effect of the power supply noise from the supply current, such that the current controlled oscillator may generate the oscillating signal with accurate oscillating frequency according to the bias current with low noise or noise-free, thus improving PSRR, the power performance and the power efficiency of the VCO.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage controlled oscillator, comprising:
   a current controlled oscillator, configured to receive a bias current and generate an oscillating signal with an oscillating frequency according to the bias current;
   a voltage to current conversion circuit, coupled to a power supply voltage and configured to generate a supply current according to an input voltage, wherein the voltage to current conversion circuit comprises:
   a first current source, configured to generate a first reference current according to the input voltage, wherein the supply current is associated with the first reference current;
   a second current source, configured to generate a second reference current according to the input voltage; and
   a voltage generation circuit, coupled to the second current source and configured to provide an internal voltage of the voltage to current conversion circuit according to the second reference current; and
   a noise cancellation circuit, coupled to the power supply voltage and the voltage to current conversion circuit, for receiving a bias voltage and the supply current from the voltage to current conversion circuit, and configured to generate a noise cancellation current in response to power supply voltage variation and cancel the noise cancellation current from the supply current to generate the bias current, wherein the bias voltage of the noise cancellation circuit is coupled to the internal voltage of the voltage to current conversion circuit.

2. The voltage controlled oscillator of claim 1, wherein the internal voltage is independent from a circuit that generates the supply current in the voltage to current conversion circuit.

3. The voltage controlled oscillator of claim 1, wherein the voltage to current conversion circuit comprises:
a first transistor pair, coupled to the first current source, and comprising:
a first transistor, comprising a first terminal coupled to the first current source and configured to mirror the first reference current, a control terminal coupled to the first terminal of the first transistor, and a second terminal coupled to the power supply voltage; and
a second transistor, comprising a first terminal configured to output the supply current which is the mirrored first reference current, a control terminal coupled to the control terminal of the first transistor, and a second terminal coupled to the power supply voltage.

4. The voltage controlled oscillator of claim 3, wherein the voltage generation circuit comprises a third transistor, comprising a first terminal coupled to the second current source and configured to receive the second reference current, a second terminal coupled to the power supply voltage, and a control terminal coupled to the noise cancellation circuit to provide the internal voltage.

5. The voltage controlled oscillator of claim 3, wherein the voltage to current conversion circuit further comprises a fourth transistor, comprising a first terminal coupled to the noise cancellation circuit to output the supply current, a control terminal coupled to the interval voltage of the voltage generation circuit, and a second terminal coupled to the first terminal of the second transistor to receive the supply current.

6. The voltage controlled oscillator of claim 3, wherein the second reference current is a product of the first reference current and a first current gain, and a product of the first current gain and a second current gain associated with the noise cancellation current of the noise cancellation circuit is equal to one, and wherein the first current gain is smaller than 1.

7. The voltage controlled oscillator of claim 1, wherein the voltage to current conversion circuit comprises:
a second transistor pair, coupled to the second current source, comprising:
a fifth transistor, comprising a first terminal coupled to the second current source and configured to receive the second reference current, a control terminal coupled to the first terminal of the fifth transistor, and a second terminal coupled to a ground voltage; and
a sixth transistor, comprising a first terminal, a control terminal coupled to the control terminal of the fifth transistor, and a second terminal coupled to the ground voltage.

8. The voltage controlled oscillator of claim 7, wherein the voltage generation circuit comprises a seventh transistor, comprising a first terminal coupled to the sixth transistor, a second terminal coupled to the power supply voltage, and a control terminal coupled to the noise cancellation circuit to current conversion circuit to provide the internal voltage.

9. The voltage controlled oscillator of claim 7, wherein the voltage generation circuit further comprises a eighth transistor, comprising a first terminal coupled to the noise cancellation circuit to output the supply current, a control terminal coupled to the interval voltage of the voltage generation circuit, and a second terminal coupled to the first current source to receive the first reference current acting as the supply current.

10. The voltage controlled oscillator of claim 7, wherein the second reference current is a product of the supply current and a first current gain, and a product of the first current gain and a second current gain associated with the noise cancellation current of the noise cancellation circuit is equal to one, and wherein the first current gain is smaller than 1.

11. The voltage controlled oscillator of claim 1, wherein the noise cancellation circuit comprises:
a power noise sensing circuit, coupled to the voltage to current conversion circuit and the power supply voltage and receiving the bias voltage from the voltage to current conversion circuit, wherein the power noise sensing circuit is configured to generate a sensing current in response to the power supply voltage variation; and
a current mirror, coupled to the power noise sensing circuit, the voltage to current conversion circuit and the current controlled oscillator, and configured to mirror the sensing current onto the noise cancellation current with a second current gain.

12. The voltage controlled oscillator of claim 9, wherein the sensing current is determined according to the power supply voltage and the internal voltage.

13. The voltage controlled oscillator of claim 11, wherein the power noise sensing circuit comprises:
a ninth transistor, comprising a first terminal coupled to the supply voltage, a control terminal coupled to the internal voltage of the voltage to current conversion circuit, and a second terminal coupled to the current mirror and configured to provide the sensing current.

14. The voltage controlled oscillator of claim 11, wherein the power noise sensing circuit comprises:
a tenth transistor, comprising a first terminal coupled to the supply voltage, a control terminal coupled to the internal voltage of the voltage to current conversion circuit, and a second terminal; and
an eleventh transistor, comprising a first terminal coupled to the current mirror and configured to provide the sensing current, a control terminal, and a second terminal coupled to the second terminal of the tenth transistor.

15. The voltage controlled oscillator of claim 11, wherein the power noise sensing circuit comprises:
a fifth current source;
a twelfth transistor, comprising a first terminal coupled to the supply voltage, a control terminal coupled to the internal voltage of the voltage to current conversion circuit, and a second terminal;
a thirteenth transistor, comprising a first terminal, a control terminal coupled to the second terminal of the twelfth transistor, and a second terminal coupled to the fifth current source; and
a fourteenth transistor, comprising a first terminal coupled to the second terminal of the twelfth transistor, a control terminal coupled to the second terminal of the thirteenth transistor, and a second terminal coupled to the current mirror and configured to provide the sensing current.

16. The voltage controlled oscillator of claim 1, wherein a width to length ratio of the first current source is different from a width to length ratio of the second current source.

* * * * *